United States Patent
Kim et al.

(10) Patent No.: US 8,307,318 B2
(45) Date of Patent: Nov. 6, 2012

(54) METHOD OF CONFIGURING A SEMICONDUCTOR INTEGRATED CIRCUIT INVOLVING CAPACITORS HAVING A WIDTH EQUAL TO THE LENGTH OF ACTIVE RESISTORS

(75) Inventors: Sung-hoon Kim, Seongnam-si (KR); Won-Il Bae, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 443 days.

(21) Appl. No.: 12/585,133

(22) Filed: Sep. 4, 2009

(65) Prior Publication Data
US 2010/0059856 A1   Mar. 11, 2010

(30) Foreign Application Priority Data

Sep. 8, 2008 (KR) .................. 10-2008-0088468

(51) Int. Cl.
*G06F 17/50* (2006.01)
*G06F 19/00* (2006.01)
*H01L 25/00* (2006.01)
*H03K 19/00* (2006.01)

(52) U.S. Cl. ........ 716/119; 716/132; 716/122; 716/123; 716/129; 716/130; 700/98; 700/121; 326/41; 326/47; 326/101

(58) Field of Classification Search .................. 716/119, 716/132, 122, 123, 129, 130; 326/41, 47, 326/101; 700/98, 121
See application file for complete search history.

(56) References Cited

U.S. PATENT DOCUMENTS

| | | | | |
|---|---|---|---|---|
| 4,443,829 A | * | 4/1984 | Delvy et al. | 361/275.3 |
| 6,591,402 B1 | * | 7/2003 | Chandra et al. | 716/106 |
| 7,051,313 B1 | * | 5/2006 | Betz et al. | 716/113 |
| 7,231,618 B2 | * | 6/2007 | Huang et al. | 716/115 |
| 7,257,794 B2 | * | 8/2007 | Tang et al. | 716/122 |
| 7,546,570 B2 | * | 6/2009 | Norman et al. | 716/101 |
| 2002/0124229 A1 | * | 9/2002 | Ohba et al. | 716/5 |
| 2006/0136856 A1 | * | 6/2006 | Tang et al. | 716/11 |

FOREIGN PATENT DOCUMENTS

| | | | |
|---|---|---|---|
| JP | 2003124332 A | * | 4/2003 |
| JP | 2003-256489 | | 9/2003 |
| JP | 2006-040962 | | 2/2006 |
| JP | 2007-067207 | | 3/2007 |

* cited by examiner

*Primary Examiner* — Phallaka Kik
(74) *Attorney, Agent, or Firm* — Harness, Dickey & Pierce, P.L.C.

(57) ABSTRACT

A method of configuring a semiconductor integrated circuit (IC) includes arranging a circuit region in the center of a unit cell. Capacitor/resistor regions are arranged along the left and right edge portions of the unit cell. The capacitor/resistor regions include a plurality of active resistors having the same length and a capacitor having a width equal to the length of the plurality of active resistors. In addition, a first conductive layer is arranged longitudinally in each of the capacitor/resistor regions so as to contact the left and right edge portions of the unit cell.

20 Claims, 2 Drawing Sheets

METHOD OF CONFIGURING A SEMICONDUCTOR INTEGRATED CIRCUIT INVOLVING CAPACITORS HAVING A WIDTH EQUAL TO THE LENGTH OF ACTIVE RESISTORS

CROSS-REFERENCE TO RELATED APPLICATIONS

This application claims priority under 35 U.S.C. §119 to Korean Patent Application No. 10-2008-0088468, filed on Sep. 8, 2008 with the Korean Intellectual Property Office, the entire disclosure of which is incorporated herein by reference.

BACKGROUND

1. Technical Field

The present invention relates to a method of laying out a semiconductor integrated circuit (IC).

2. Description of the Related Art

Due to the miniaturization of semiconductor integrated circuits, the prevention of noise in semiconductor integrated circuits has become increasingly important. By inserting a decoupling capacitor into a power circuit of an integrated circuit (e.g., power routing and ground routing), the electric potential of the power circuit can be stabilized, the integrated circuit can operate in a stable manner, and the properties of the integrated circuit can be improved. Hereinafter, the term "decoupling capacitor" may be used interchangeably with the term "power capacitor."

To design a semiconductor integrated circuit, a chip layout is determined first. In particular, input/output blocks are arranged, and functional blocks (such as analog signal circuit blocks, a core, or the like) are arranged. Wiring is arranged between the input/output blocks and the analog signal circuit blocks. Since wiring transferring an analog signal needs to be arranged according to noise reduction or impedance matching, the wiring can be manually arranged. Unit cells including a logic circuit (such as an NAND gate, a NOR gate, a flip-flop, etc.) are arranged between the functional blocks. Wiring between the unit cells, between the input/output block and the functional blocks, and between the functional block and the unit cells is also designed. The arrangement and wiring operation of a layout pattern of the integrated circuit chip are performed in a similar manner.

When a power capacitor is to be inserted, a chip layout is initially determined, and the power capacitor is then manually inserted into a predetermined space. Typically, the power capacitor and power wiring can be manually connected. In particular, a capacitor is inserted in spaces which do not belong to the input/output block and the functional block (between the input/output block and the functional block as well as between functional blocks). The capacitor and the power wiring are connected, and an integrated circuit chip layout pattern is subsequently completed.

However, since the input/output block and the functional block are arranged first during the design of a semiconductor integrated circuit, the shape or size of a space in which a capacitor is to be inserted may not match the dimensions of the capacitor. As a result, a relatively long period of time is needed to arrange the capacitor in the space so as to achieve a large capacity. In addition, increased skill may be required to arrange the elements, since the capacitance of a capacitor can vary according to a designer.

SUMMARY

A method of configuring a semiconductor integrated circuit (IC) according to the present invention includes arranging a circuit region within a unit cell; and arranging capacitor/resistor regions along opposing edges of the unit cell, each of the capacitor/resistor regions having at least one active resistor and capacitor, the capacitor having a width equal to a length of the active resistor. The method may further comprise arranging at least one first conductive layer along at least one of the capacitor/resistor regions.

The capacitor may include a metal-oxide-semiconductor (MOS) transistor, wherein one of the first conductive layers is connected to a gate of the metal-oxide-semiconductor transistor, and a second conductive layer is connected to a source and drain of the metal-oxide-semiconductor transistor. The metal-oxide-semiconductor transistor may be an NMOS transistor, the first conductive layer connected to the gate of the NMOS transistor may be further connected to a power voltage source, and the second conductive layer connected to the source and drain of the NMOS transistor may be further connected to a ground voltage source.

The method of configuring a semiconductor integrated circuit may further include arranging the unit cell so as to be adjacent to at least another unit cell. The circuit region may have a layout including an NMOS transistor region and a PMOS transistor region, the layout of the circuit region being identical to that of an adjacent circuit region of an adjacent unit cell. Alternatively, the circuit region may have a layout including an NMOS transistor region and a PMOS transistor region, the layout of the circuit region being symmetrical to that of an adjacent circuit region of an adjacent unit cell.

The method of configuring a semiconductor integrated circuit may further include arranging a dummy capacitor region having a plurality of dummy capacitors between the unit cell and an adjacent unit cell, the plurality of dummy capacitors using one of the first conductive layers as an electrode. The plurality of dummy capacitors may include a metal-oxide-semiconductor transistor, wherein one of the first conductive layers is connected to a gate of the metal-oxide-semiconductor transistor, and the second conductive layer is connected to a source and drain of the metal-oxide-semiconductor transistor and is further connected to a ground voltage source. The metal-oxide-semiconductor transistor may be an NMOS transistor, and the first conductive layer connected to the gate of the NMOS transistor is further connected to a power voltage source.

The capacitor/resistor regions may include an antenna diode that facilitates a flow of irregular charges towards a substrate, wherein the irregular charges are generated during a manufacture of a gate region of a metal-oxide-semiconductor transistor.

BRIEF DESCRIPTION OF THE DRAWINGS

Example embodiments of the present invention may be more readily appreciated when the following detailed description is read in conjunction with the accompanying drawing in which.

DETAILED DESCRIPTION

Figure 1:
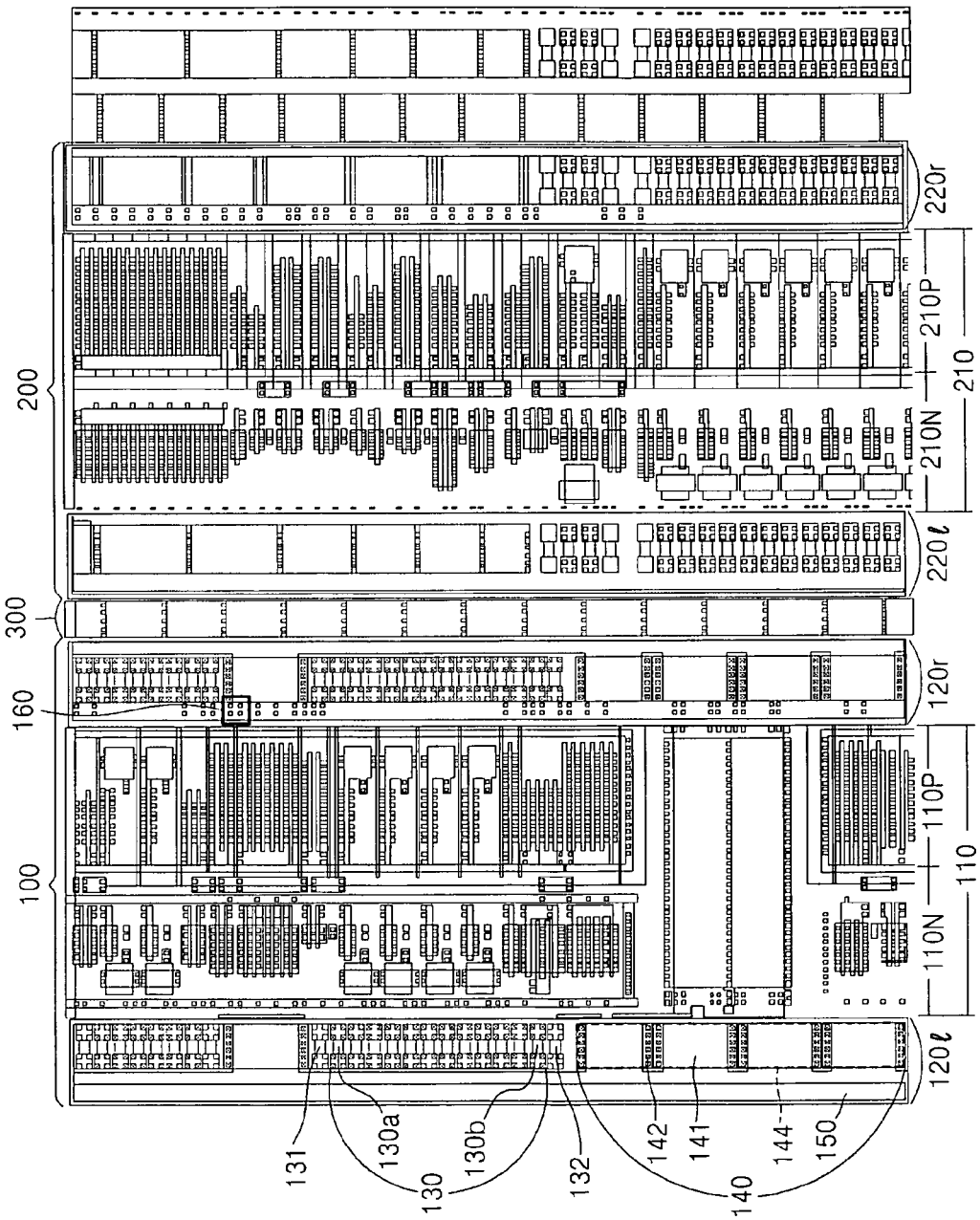
FIG. 1 illustrates a semiconductor integrated circuit (IC) configured according to a layout method of the present invention.

Hereinafter, example embodiments of the present invention will be described in further detail with reference to the attached drawings. Like reference numerals in the drawings denote like elements.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
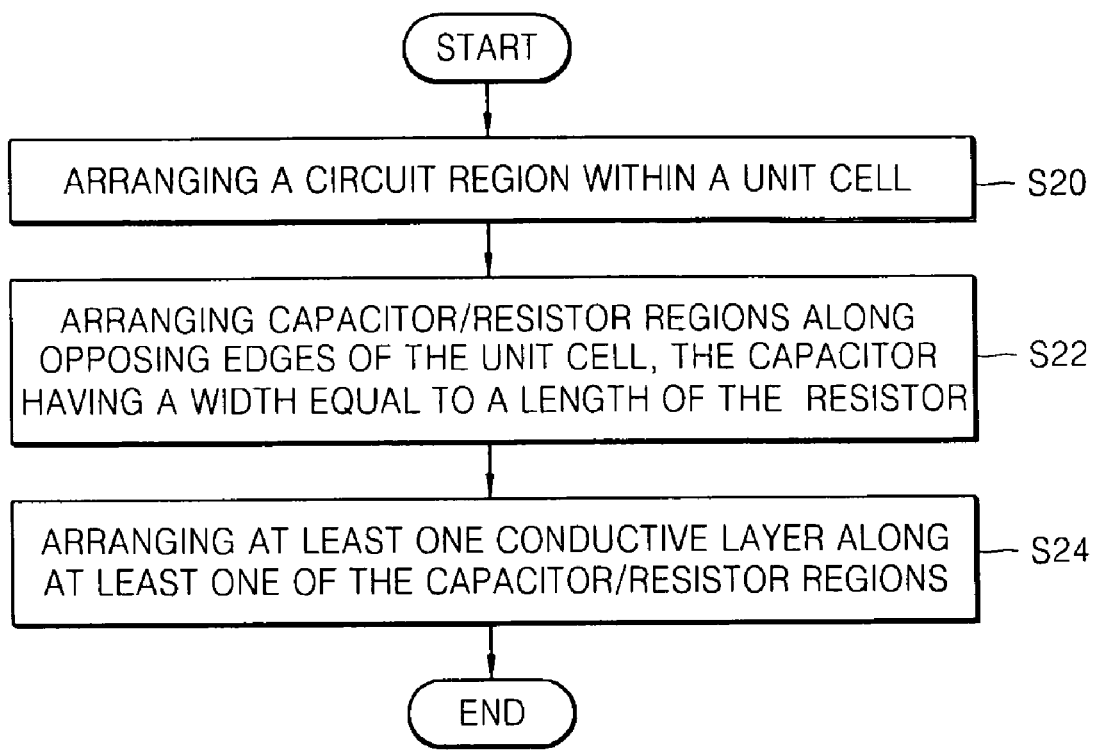
FIG. 2 illustrates the layout method of FIG. 1.

FIGS. 1 and 2 illustrate a semiconductor integrated circuit (IC) configured according to a layout method of the present invention. For purposes of brevity, a semiconductor integrated circuit with only two unit cells is illustrated. However, it should be understood that the number of unit cells may vary as needed. For example, a semiconductor integrated circuit may be configured so as to have three (or more) unit cells.

Referring to FIG. 1 in conjunction with FIG. 2, the semiconductor integrated circuit has a first unit cell 100 and a second unit cell 200. The first unit cell 100 is arranged so as to be adjacent to the second unit cell 200 (S20). The first unit cell 100 includes a first circuit region 110, a first capacitor/resistor region 120*l*, and a second capacitor/resistor region 120*r*. The first circuit region 110 is arranged between the first and second capacitor/resistor regions 120*l* and 120*r*. The second unit cell 200 includes a second circuit region 210, a third capacitor/resistor region 220*l*, and a fourth capacitor/resistor region 220*r*. The second circuit region 210 is arranged between the third and fourth capacitor/resistor regions 220*l* and 220*r*.

The first and second circuit regions 110 and 210 include logic circuits with n-type metal-oxide-semiconductor (NMOS) and p-type metal-oxide-semiconductor (PMOS) transistors. Examples of suitable logic circuits include a complementary metal-oxide-semiconductor (CMOS) inverter cell, a NAND gate, a NOR gate, an inverter, a flip-flop, etc.

Functional blocks are arranged in the first and second circuit regions 110 and 210. The first circuit region 110 is divided into a region 110N with NMOS transistors formed thereon and a region 110P with PMOS transistors formed thereon. The shape and/or configuration of the NMOS transistor region 110N may be identical or symmetrical to that of the PMOS transistor region 110P. Although the NMOS transistor region 110N is illustrated as being arranged on the left side of the first circuit region 110 (and the PMOS transistor region 110P arranged on the right side), it should be understood that the arrangement may be reversed.

Similarly, the second circuit region 210 is divided into a region 210N with NMOS transistors formed thereon and a region 210P with PMOS transistors formed thereon. The shape and/or configuration of the NMOS transistor region 210N may be identical or symmetrical to that of the PMOS transistor region 210P. Although the NMOS transistor region 210N is illustrated as being arranged on the left side of the second circuit region 210 (and the PMOS transistor region 210P arranged on the right side), it should be understood that the arrangement may be reversed.

The first and second capacitor/resistor regions 120*l* and 120*r* are arranged on the left and right edge regions of the first circuit region 110, respectively (S22). Similarly, the third and fourth capacitor/resistor regions 220*l* and 220*r* are arranged on left and right edge regions of the second circuit region 210, respectively.

A plurality of active resistors 130 and a plurality of capacitors 140 are arranged in a row in the first capacitor/resistor region 120*l*. In FIG. 1, the plurality of active resistors 130 are formed as N-type diffusion layers. However, it should be understood that the plurality of active resistors 130 may be formed as P-type or N-type diffusion layers. Active end resistors 130*a* and 130*b* are respectively disposed at the first and second end of the row of active resistors 130. Dummy active patterns 131 and 132 are arranged adjacently to the active end resistors 130*a* and 130*b*, respectively. The dummy active patterns 131 and 132 are provided to ensure that the plurality of active resistors 130 have the same properties (e.g., same resistance).

The plurality of capacitors 140 may include PMOS or NMOS transistors using an ultraslim gate layer as a dielectric layer. Thus, the plurality of capacitors 140 can ensure a relatively large capacitance. In FIG. 1, the plurality of capacitors 140 of the first capacitor/resistor region 120*l* may include, for example, NMOS transistors. A gate region 141 of an NMOS transistor is connected to a first conductive layer 150, and source and drain regions 142 of the NMOS transistor are connected to a second conductive layer 144. The first conductive layer 150 and the second conductive layer 144 are separate and different conductive layers (e.g., polysilicon layer, metal layer, tungsten layer) (S24). The capacitor 140 may be implemented as a decoupling capacitor by connecting the first conductive layer 150 to a power voltage source and connecting the second conductive layer 144 to a ground voltage source. The width W of the capacitor 140 is equal to the length L of the active resistor 130 according to a common dimensional axis (e.g., x-axis). In the first capacitor/resistor region 120*l*, the first conductive layer 150 is arranged longitudinally along an edge portion of the first unit cell 100.

The arrangement of the second capacitor/resistor region 120*r* may be similar to that of the first capacitor/resistor region 120*l*. For example, the second capacitor/resistor region 120*r* may include active resistors, dummy active patterns, and capacitors including NMOS transistors. Additionally, the width of the capacitor is the same as the length of the active resistor. Furthermore, in the second capacitor/resistor region 120*r*, a first conductive layer connected to a power voltage source is arranged longitudinally along an edge portion of the first unit cell 100.

As illustrated in FIG. 1, an antenna diode 160 is disposed in the second capacitor/resistor region 120*r*. However, it should be understood that an antenna diode 160 may also be disposed one or more of the other capacitor/resistor regions. The antenna diode 160 prevents plasma damage from occurring during the manufacture of a gate region of an NMOS transistor. When an NMOS transistor is manufactured using a plasma process, irregular charges are generated during a dry etching process (that is used to form gate and wiring lines) or during an ashing process (that is used to remove a photosensitive pattern). The irregular charges flow towards both edge sidewalls and a surface of a conductive layer constituting a gate or wiring line. As a result, plasma damage (e.g., damage to a gate insulating layer) may occur. Semiconductor device problems resulting from plasma damage may be difficult to detect and often evade the initial screening stage.

The antenna diode 160 may use a junction diode as a gate (e.g., an NP diode in the case of an NMOS transistor or a PN diode in the case of a PMOS transistor), so that irregular charges generated during the plasma process may flow towards a substrate through the junction diode. In FIG. 1, the antenna diode 160 uses an NP diode as a gate of an NMOS transistor so that irregular charges generated during the plasma process may flow towards a substrate through the junction diode. The gate of the NMOS transistor is connected to an N-well bias circuit adjacent to the gate. Because the N-well bias circuit is a power voltage source, and a bias of a P-substrate below an N-well is a ground voltage source, an NP diode is formed on a boundary interface between the N-well circuit and the P-substrate.

The second unit cell 200 may be arranged in a manner similar to that of the first unit cell 100. Third and fourth capacitor/resistor regions 220*l* and 220*r* are arranged on the left and right sides of the second circuit region 210, respectively. The second circuit region 210 is disposed in the center of the second unit cell 200 and between the third and fourth capacitor/resistor regions 220*l* and 220*r*. Like the first circuit region 110 of the first unit cell 100, the second circuit region 210 is divided into a region 210N with NMOS transistors formed thereon and a region 210P with PMOS transistors formed thereon. Thus, the second unit cell 200 has the same arrangement as the first unit cell 100. Alternatively, the locations of the NMOS transistor region 210N and the PMOS transistor region 210P of the second circuit region 210 may be reversed. In such a case, the second unit cell 200 would be symmetrical to the first unit cell 100.

The third and fourth capacitor/resistor regions 220*l* and 220*r* may be arranged similarly to that of the first and second capacitor/resistor regions 120*l* and 120*r* of the first unit cell 100. For example, the third and fourth capacitor/resistor regions 220*l* and 220*r* include a plurality of capacitors and active resistors. Additionally, the width of the capacitor is the same as the length of the active resistors. Furthermore, in the third capacitor/resistor region 220*l*, a first conductive layer connected to the power voltage source is arranged longitudinally along an edge portion of the second unit cell 200.

As illustrated in FIG. 1, a dummy capacitor region 300 is arranged between the first unit cell 100 and the second unit cell 200. The dummy capacitor region 300 includes capacitors embodied as a PMOS or NMOS transistor using an ultra-slim gate layer as a dielectric layer. When the dummy capacitor region 300 includes, for example, NMOS transistors, source and drain regions of the NMOS transistors are connected to a second conductive layer (that is connected to the ground voltage source), and a gate region of the NMOS transistor is connected to a first conductive layer (that is connected to the power voltage source). As a result, a first conductive layer connected to the power voltage source is arranged longitudinally in the second capacitor/resistor region 120*r* along an edge portion of the first unit cell 100. A first conductive layer connected to the power voltage source is also arranged longitudinally in the third capacitor/resistor region 220*l* along an edge portion of the second unit cell 200. Thus, the gate region of the dummy capacitor region 300 is connected to the first conductive layers along the edge regions of the first and second unit cells 100 and 200.

Alternatively, the dummy capacitor region 300 may be omitted. As a result, the first unit cell 100 may directly adjoin the second unit cell 200. In such a case, the first conductive layer along the edge portion of the first unit cell 100 will be directly connected to the first conductive layer along the edge portion of the second unit cell 200.

According to the layout method of the semiconductor integrated circuit of FIG. 1, the length L of the active resistor 130 is the same as the width W of the capacitor 140. As a result, the capacity of the capacitor 140 can be calculated more accurately, and the period of time needed to obtain the capacity can be reduced. In addition, since the first conductive layer of the power voltage source is arranged in a longitudinal direction along the edges of the first and second unit cells 100 and 200, reinforcing a power line and connecting adjacent unit cells may be performed with greater ease.

While example embodiments of the present invention have been disclosed herein, it should be understood that other variations may be possible. Such variations are not to be regarded as a departure from the spirit and scope of the example embodiments of the present invention, and all such modifications as would be obvious to one skilled in the art are intended to be included within the scope of the following claims.

What is claimed is:

1. A method of configuring a semiconductor integrated circuit, comprising:
   arranging a circuit region within a unit cell on a semiconductor substrate; and
   arranging capacitor/resistor regions along opposing edges of the unit cell on the semiconductor substrate, each of the capacitor/resistor regions having at least one active resistor and capacitor, the capacitor having a width equal to a length of the active resistor.

2. The method of claim 1, wherein the circuit region is arranged in a center of the unit cell.

3. The method of claim 1, wherein the width of the capacitor is equal to the length of the active resistor according to a common dimensional axis.

4. The method of claim 3, wherein the common dimensional axis is perpendicular to a longitudinal axis of at least one of the capacitor/resistor regions.

5. The method of claim 1, further comprising:
arranging at least one first conductive layer along at least one of the capacitor/resistor regions.

6. The method of claim 5, wherein the first conductive layer is arranged along a longitudinal axis of at least one of the capacitor/resistor regions.

7. The method of claim 5, wherein the first conductive layer is arranged so as to contact at least one of the opposing edges of the unit cell.

8. The method of claim 5, wherein
the capacitor includes a metal-oxide-semiconductor transistor,
the first conductive layer is connected to a gate of the metal-oxide-semiconductor transistor, and
a second conductive layer is connected to a source and drain of the metal-oxide-semiconductor transistor.

9. The method of claim 8, wherein
the metal-oxide-semiconductor transistor is an NMOS transistor,
the first conductive layer that is connected to the gate of the NMOS transistor is further connected to a power voltage source, and
the second conductive layer that is connected to the source and drain of the NMOS transistor is further connected to a ground voltage source.

10. The method of claim 5, further comprising:
arranging a dummy capacitor region having a plurality of dummy capacitors between the unit cell and an adjacent unit cell, the plurality of dummy capacitors using the first conductive layer as an electrode.

11. The method of claim 10, wherein
the plurality of dummy capacitors include a metal-oxide-semiconductor transistor,
the first conductive layer is connected to a gate of the metal-oxide-semiconductor transistor, and
a second conductive layer is connected to a source and drain of the metal-oxide-semiconductor transistor and is further connected to a ground voltage source.

12. The method of claim 11, wherein
the metal-oxide-semiconductor transistor is an NMOS transistor, and
the first conductive layer that is connected to the gate of the NMOS transistor is further connected to a power voltage source.

13. The method of claim 1, further comprising:
arranging the unit cell so as to be adjacent to at least another unit cell.

14. The method of claim 13, wherein the circuit region has a layout including an NMOS transistor region and a PMOS transistor region, the layout of the circuit region being identical to that of an adjacent circuit region.

15. The method of claim 13, wherein the circuit region has a layout including an NMOS transistor region and a PMOS transistor region, the layout of the circuit region being symmetrical to that of an adjacent circuit region.

16. The method of claim 1, wherein the capacitor/resistor regions include an antenna diode that facilitates a flow of irregular charges towards the semiconductor substrate.

17. The method of claim 1, wherein the at least one active resistor includes a plurality of active resistors, the plurality of active resistors being of equal length.

18. The method of claim 17, further comprising:
arranging the plurality of active resistors in a column along at least one of the capacitor/resistor regions.

19. The method of claim 18, further comprising:
arranging a dummy active pattern at an end of the column of active resistors.

20. A semiconductor integrated circuit architecture, comprising:
a circuit region within a unit cell; and
capacitor/resistor regions along opposing edges of the unit cell, each of the capacitor/resistor regions having at least one active resistor and capacitor, the capacitor having a width equal to a length of the active resistor.

* * * * *